(12) United States Patent
Chang et al.

(10) Patent No.: US 11,682,671 B2
(45) Date of Patent: Jun. 20, 2023

(54) INTEGRATED CIRCUIT STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Wei-Ling Chang, Hsinchu (TW); Lee-Chung Lu, Taipei (TW); Xiangdong Chen, San Diego, CA (US); Kam-Tou Sio, Hsinchu County (TW); Hsiang-Chi Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 10 days.

(21) Appl. No.: 17/037,447

(22) Filed: Sep. 29, 2020

(65) Prior Publication Data

US 2021/0143150 A1   May 13, 2021

Related U.S. Application Data

(60) Provisional application No. 62/928,776, filed on Oct. 31, 2019.

(51) Int. Cl.
*H01L 21/8238* (2006.01)
*H01L 27/092* (2006.01)
(Continued)

(52) U.S. Cl.
CPC ...... *H01L 27/092* (2013.01); *H01L 21/28123* (2013.01); *H01L 21/823828* (2013.01);
(Continued)

(58) Field of Classification Search
CPC ....... H01L 27/092; H01L 29/08; H01L 29/49; H01L 29/0847; H01L 29/66; H01L 29/78;
(Continued)

(56) References Cited

U.S. PATENT DOCUMENTS

2013/0178039 A1* 7/2013 Ko ................. H01L 27/0629
257/E21.004
2013/0200441 A1* 8/2013 Labonte ............ H01L 21/76897
257/E21.586
(Continued)

*Primary Examiner* — Chuong A Luu
(74) *Attorney, Agent, or Firm* — WPAT Law; Anthony King

(57) ABSTRACT

An integrated circuit structure includes a first transistor, a second transistor, a first conductive via, a second conductive via, and a connection line. The first transistor includes a first active region, a first gate electrode over the first active region; and a first channel in the first active region and under the first gate electrode. The second transistor includes a second active region, a second gate electrode over the second active region, and a second channel in the second active region and under the second gate electrode. The first conductive via is electrically connected to the first gate electrode. The second conductive via is electrically connected to the second gate electrode. The connection line electrically connects the first and second conductive vias. The first transistor and the first conductive via and the second transistor and the second conductive via are arranged mirror-symmetrically with respect to a symmetry plane.

20 Claims, 10 Drawing Sheets

(51) Int. Cl.
  *H01L 23/528* (2006.01)
  *H01L 29/08* (2006.01)
  *H01L 21/28* (2006.01)
  *H01L 29/49* (2006.01)

(52) U.S. Cl.
  CPC .... *H01L 21/823871* (2013.01); *H01L 23/528* (2013.01); *H01L 29/0847* (2013.01); *H01L 29/4916* (2013.01)

(58) Field of Classification Search
  CPC ........... H01L 29/4916; H01L 29/66484; H01L 29/7831; H01L 23/522; H01L 23/528; H01L 23/5226; H01L 21/8234; H01L 21/8238; H01L 21/28; H01L 21/823475; H01L 21/823871; H01L 21/823828; H01L 21/28123; H01L 21/82385; H01L 29/417; H01L 29/806; H01L 29/41725; H01L 29/41791; H01L 29/7839; H01L 29/4925; H01L 29/4941; H01L 29/4958; H01L 29/0891; H01L 29/0843; H01L 29/66636; H01L 29/66643; H01L 29/16; H01L 29/18; H01L 29/22; H01L 29/36; H01L 29/365; H01L 29/2206; H01L 29/1608; H01L 21/823418; H01L 21/823425; H01L 21/823814; H01L 21/823821; H01L 21/823892; H01L 21/823885; H01L 27/0924; H01L 27/0928; H01L 27/11807
  USPC ......................................................... 257/369
  See application file for complete search history.

(56) References Cited

U.S. PATENT DOCUMENTS

2015/0179646 A1* 6/2015 Azmat ................ H01L 27/0207
    257/369
2016/0111341 A1* 4/2016 Kim .................... H01L 27/0207
    438/424

\* cited by examiner

US 11,682,671 B2

INTEGRATED CIRCUIT STRUCTURE AND METHOD FOR MANUFACTURING THE SAME

PRIORITY DATA

This patent claims the benefit of U.S. Provisional Patent Application Ser. No. 62/928,776 filed on Oct. 31, 2019, the entire disclosure of which is hereby incorporated by reference.

BACKGROUND

Integrated circuits, which comprise a large number of transistors, specifically, metal-oxide-semiconductor ("MOS") transistors, are widely used in electronic devices such as cell phones, computers and digital home appliances. Growing demand for smaller and thinner electronic devices with more functions leads to the research and development of transistors with smaller dimensions in order to allow more transistors to be packed within a device in a greater amount to perform more functions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
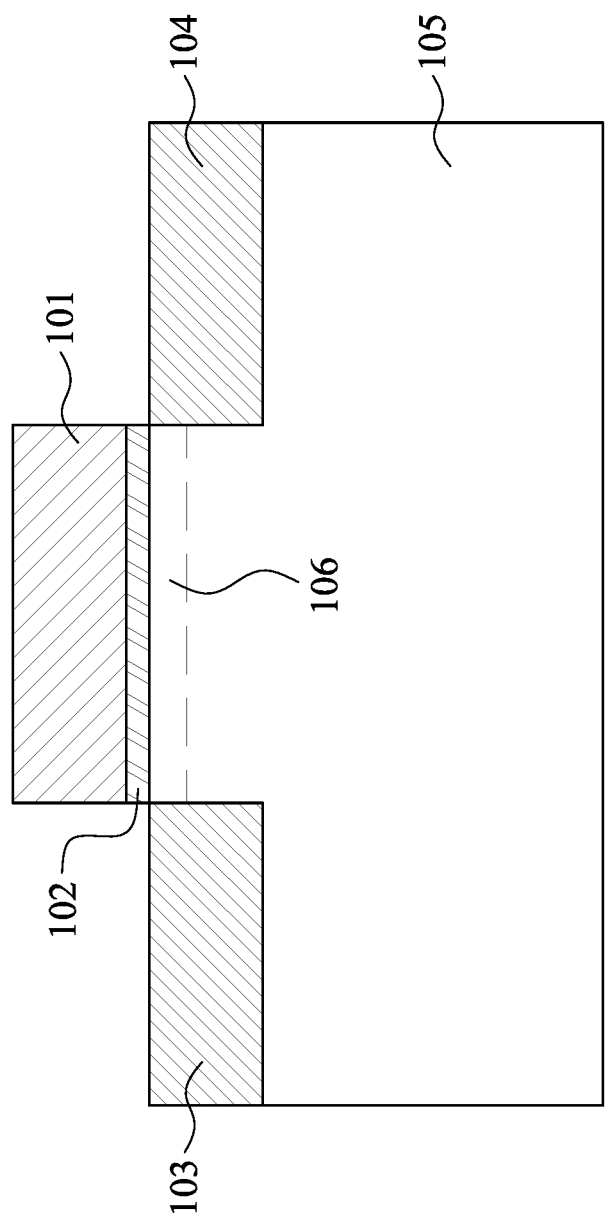
FIG. 1 shows a schematic MOS transistor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to 4°, less than or equal to ±3°, less than or equal to ±2°, less than or equal to ±1, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°.

Referring to FIG. 1, FIG. 1 schematically shows a MOS transistor structure including a gate electrode 101, a gate dielectric layer (or "gate oxide layer") 102, and a source region 103, and a drain region 104 formed in a substrate 105. In some embodiments, the source region 103 and drain region 104 are formed in the substrate 105 by doping impurities into the substrate 105 to define the source region 103 and the drain region 104. The gate dielectric layer 102 located under the gate electrode 101 acts as an insulator to prevent electrons transfer from the gate electrode 101 to the substrate 105, or from the source region 103/drain region 104 to the gate electrode 101, in accordance with some embodiments of the present disclosure. In some embodiments, the gate dielectric layer 102 may be formed by thermal oxidation of the substrate 105 to form a thin layer of gate dielectric layer.

Types of the MOS transistors may include: a) positive-channel MOS transistor ("PMOS") and b) negative-channel MOS transistor ("NMOS"). A combination of a PMOS transistor and an NMOS transistor appearing in pair and being used in a complementary way to form an effective means of electrical control is called a complementary metal-oxide-semiconductor ("CMOS") transistor. For a PMOS transistor, the substrate 105 is an n-doped silicon substrate with a p-doped source region 103 and a p-doped drain region 104, respectively, and for an NMOS transistor, the substrate 105 is a p-doped substrate with an n-doped source region 103 and an n-doped drain region 104, respectively.

The MOS transistor is operated by applying voltage to the MOS transistor to control the "on" and "off" of the MOS transistor for transmitting/interrupting signals. In some embodiments, the MOS transistor shown in FIG. 1 is an NMOS transistor, when the applied gate voltage is below the threshold for making a conductive channel below the gate electrode 101 and gate dielectric layer 102, there is little or no conduction between the source region 103 and drain region 104; the switch of the NMOS transistor is off. However, when the applied gate voltage is over the threshold, the gate attracts electrons, inducing an n-type conductive channel 106 in the substrate below the gate dielectric 102, which allows electrons to flow between the source region 103 and the drain region 104 and the switch is on.

In some embodiments, the MOS transistor shown in FIG. 1 is a PMOS transistor, when the applied gate voltage is below the threshold for making a conductive channel below the gate electrode 101 and gate dielectric layer 102, there is little or no conduction between the source region 103 and drain region 104; the switch of the PMOS transistor is off. However, when the applied gate voltage is over the threshold, the gate attracts electrons, inducing a p-type conductive channel 106 in the substrate below the gate dielectric 102, which allows electrons to flow between the source region 103 and the drain region 104 and the switch is on.

In some embodiments, the material of the gate 101 is a metal, such as tantalum, tungsten, tantalum nitride, and titanium nitride, or polycrystalline silicon ("polysilicon," or "POLY") and the substrate is silicon. In some embodiments where the material of the gate 101 is a tantalum, tungsten, tantalum nitride, and titanium nitride, the material of the gate dielectric is a high-k dielectric. For a MOS transistor, a connection line ("metal wires"; "interconnect(s)") is used for electrically connecting two or more transistors together. Specifically, the connection line and the transistors are electrically connected by a conductive via, or "via contact" or "gate via" located between the gate electrode and the connection line.

The scaling-down of the dimensions of the transistors basically follows the Moore's Law, which describes the empirical regularity that the number of transistors on integrated circuit doubles approximately every two years. In last few decades, the development of very-large-scale integration ("VLSI") or ultra-large-scale integration ("ULSI"), i.e., the method of making an integrated circuit by combining huge numbers (such as millions or even billions) of transistors, specifically, MOS transistors, onto a single chip, enables complex semiconductor and telecommunication technologies to be developed.

However, as the gate length and gate height of the transistors are scaling down to meet the requirements for electronic devices of smaller sizes with more functions, it is found that the gate resistance is scaling up and the RC delay increases. The RC delay, or "RC time constant ("τ"), refers to the time required to charge the capacitor, through the resistor, from an initial charge voltage of zero to approximately 63.2% of the value of an applied DC voltage, or to discharge the capacitor through the same resistor to approximately 36.8% of its initial charge voltage, which is equal to the product of the circuit resistance and the circuit capacitance. The RC time constant can be described in the following formula: τ=R*C, where R refers to the total resistance of the integrated circuit and the unit of R is ohm; C refers to the total capacitance, and the unit of C is farads, and the unit of the product of R*C, τ, is seconds.

Figure 2B:
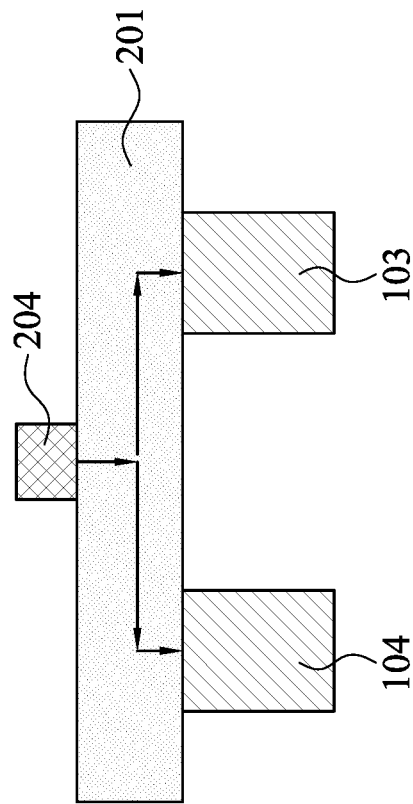
FIG. 2B shows a cross-sectional view of the integrated circuit structure of FIG. 2A.
Figure 2A:
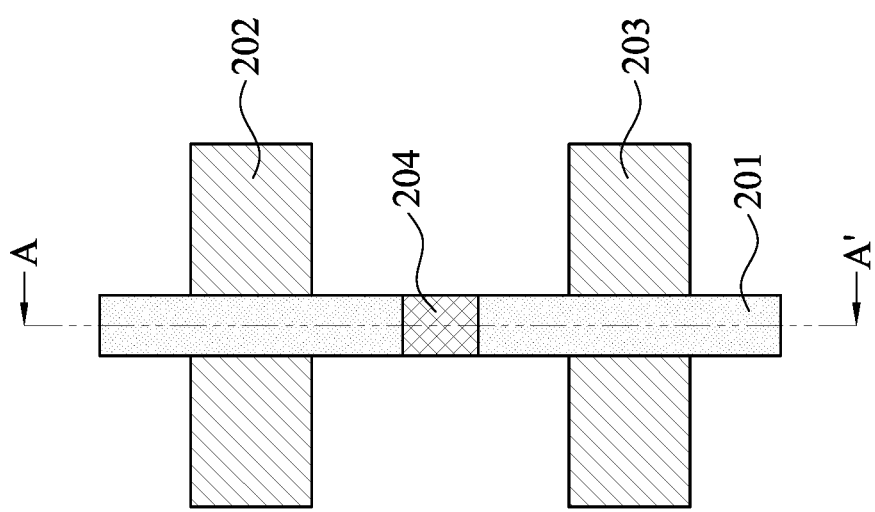
FIG. 2A shows exemplary plan view of an integrated circuit layout in accordance with some embodiments of the present disclosure.

Referring to FIGS. 2A and 2B, FIG. 2A shows exemplary plan view of an integrated circuit layout including two transistors electrically connected to the connection line (not shown in the figure) through a conductive via (or "contact via") in accordance with some embodiments of the present disclosure, and FIG. 2B shows a cross-sectional view of the integrated circuit structure as shown in FIG. 2A along the AA' line. In FIG. 2A, a gate line 201 extending in a first direction is arranged above the active regions 202 and 203, wherein the active regions 202 and 203 both extend in a second direction which is orthogonal to the first direction, and a conductive via 204 is located on the gate line 201. The gate electrodes (not shown) are formed along the gate line within the area overlapping the active regions 202 and 203, and the source regions and drain regions for each of the two transistors are formed on the active regions 202 and 203 within the areas adjacent to the area covered by the gate line 201 by doping n-type or p-type impurities to define the source/drain regions as needed. A conductive via 204 is formed on the gate line 201 to electrically connect the gate electrodes to the connection line (not shown) formed above the transistors for applying voltage(s) to the transistors to electrically control the switch on/off of the transistors.

In some embodiments, the integrated circuit structure shown in FIG. 2A is a CMOS transistor including both a PMOS transistor (not shown in FIG. 2A) on the active region 202 and an NMOS transistor (not shown in FIG. 2A) on the active region 203, wherein the PMOS transistor and the NMOS transistor are electrically connected to a connection line (not shown) by the single conductive via 204 located on the surface of the gate line 201 within the area between the position of the gate electrodes of the PMOS transistor and the NMOS transistor. In some embodiments, the active regions 202 and 203 include oxide-diffused regions. In some embodiments, the oxide-diffused regions refer to regions that are oxide-based which are further diffused by n-type or p-type impurities to form the drain/source regions of the PMOS and/or NMOS transistors.

Referring to FIG. 2B, the arrows in FIG. 2B refer to the current flow from the conductive via 204 of the integrated circuit structure of FIG. 2A to the gate electrodes (not shown) which leads to the creation of a channel under the gate electrodes for carriers (electrons/holes) to flow from the source regions to the drain regions when a voltage is applied to the transistors to switch on the transistor(s). As the current flows, resistances are measured, which include a conductive via resistance, sheet resistances along the gate line 201, and gate resistances of both transistors.

Figure 3A:
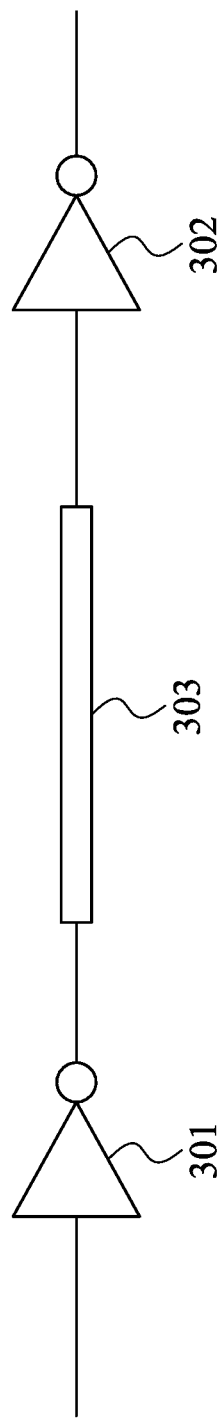
FIG. 3A shows a schematic integrated circuit structure in accordance with some embodiments of the present disclosure.
Figure 3B:
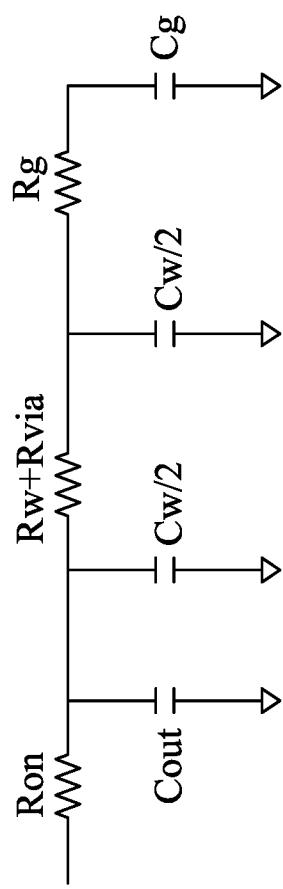
FIG. 3B shows the circuit diagram of the schematic integrated circuit structure of FIG. 3A.

In advanced semiconductor manufacturing operations, it is found that the impact of the gate resistance in the overall RC delay performance increases as the integrated circuits are down-scaled. Referring to FIGS. 3A and 3B, which are to demonstrate the delay calculation of the gate and the interconnect attached to it. FIG. 3A shows a schematic integrated circuit structure of two inverters 301 and 302 electrically connected by the interconnect 303 in accordance with some embodiments of the present disclosure. In some embodiments, the inverters are CMOS inverters. FIG. 3B shows the circuit diagram of the schematic integrated circuit structure of FIG. 3A, wherein the RC delay of the structure is calculated by the following formula: $\tau = R_{on}*(C_{out}+C_g+C_w)+(R_w+R_{via})*(C_g+0.5C_w)+R_g*C_g$, where $R_{on}$ refers to transistor resistance, $R_w$ refers to wire resistance, $R_{via}$ refers to via resistance, $C_g$ refers to input pin capacitance, and $R_g$ refers to gate input resistance. It is found that from the 7 nm semiconductor technology node to the down-scaled 5 nm semiconductor technology node, the gate resistance impact increases more than twofold in the overall RC delay performance. Specifically, gate resistance has more impact in high track library because of the longer gate line which contributes to higher gate capacitance.

Figure 4:
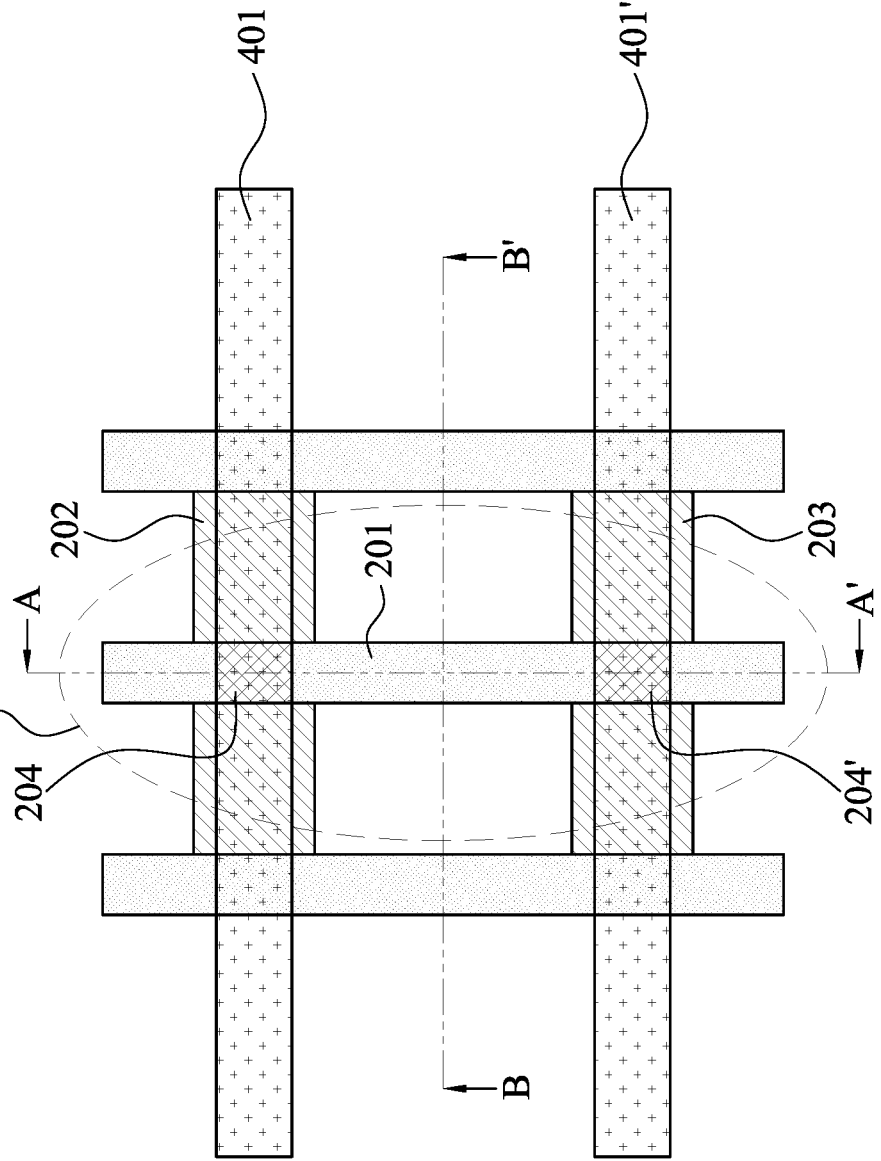
FIG. 4 shows exemplary plan view of the aforementioned integrated circuit structure in accordance with some embodiments of the present disclosure.
Figure 5:
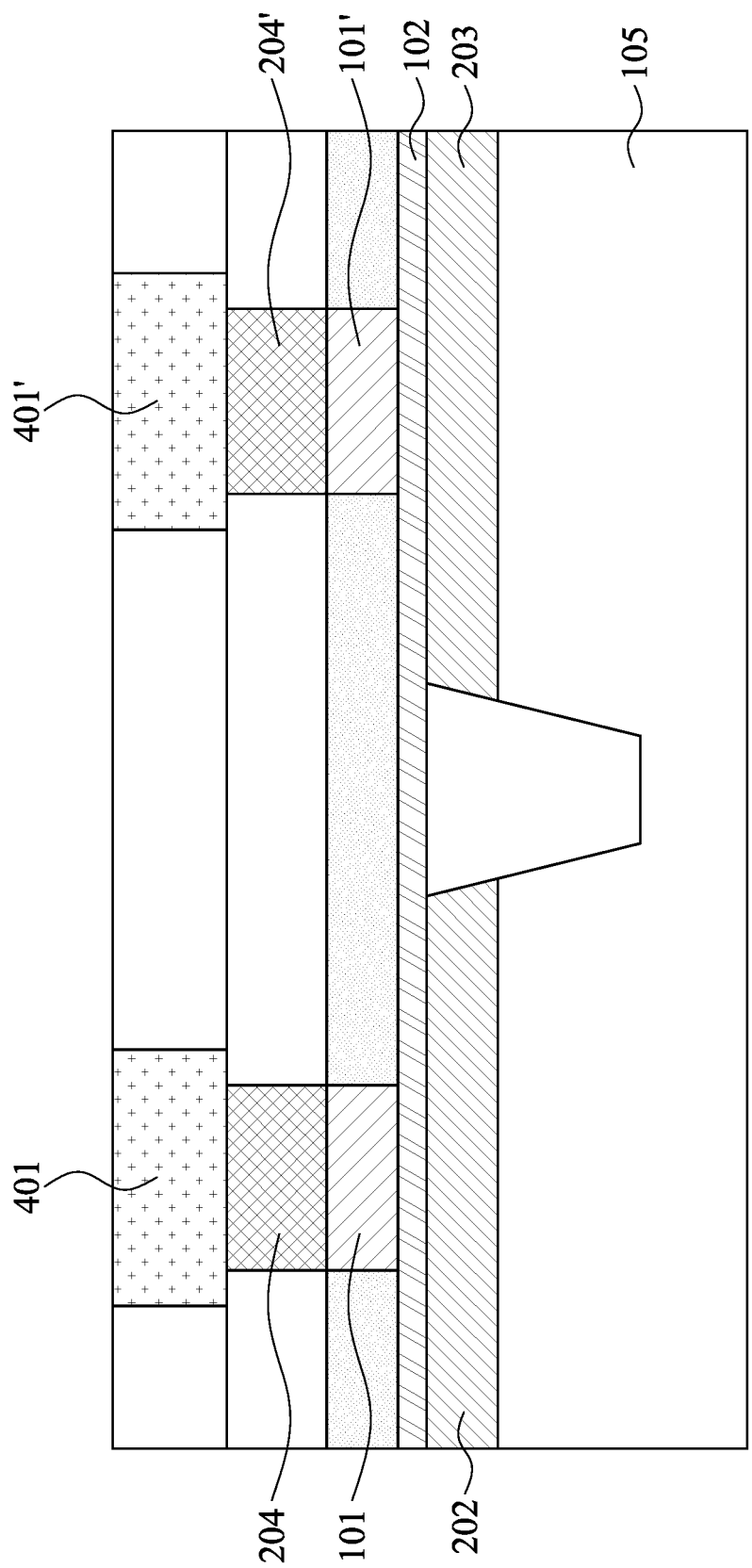
FIG. 5 shows the cross-sectional view of the integrated circuit structure of FIG. 4.

In some embodiments of the present disclosure, an integrated circuit structure including two transistors, such as a CMOS transistor including a pair of a PMOS transistor and an NMOS transistor, two conductive vias electrically connecting to the two transistors, respectively, and a connection line electrically connecting the two conductive vias, is provided. Referring to FIG. 4 and FIG. 5, FIG. 4 shows exemplary plan view of the aforementioned integrated circuit structure having two transistors with two conductive vias and a connection line and FIG. 5 shows the cross-sectional view of the integrated circuit structure of FIG. 4 along the AA' line. The integrated circuit structure includes a first transistor (not shown in the figure) and a second transistor (not shown in the figure), wherein the first transistor includes a first active region 202, a first gate electrode 101 over the first active region 202; and a first channel (not shown) in the first active region 202 and under the first gate electrode 101, wherein the second transistor includes a second active region 203, a second gate electrode 101' over the second active region 203; and a second channel (not shown) in the second active region and under the second gate electrode; a first conductive via 204 electrically connected to the first gate electrode; a second conductive via 204' electrically connected to the second gate electrode; and a connection line including but not limited to connection wires 401 and 401' electrically connecting the first conductive via 204 and the second conductive via 204', and wherein the first transistor and the first conductive via 204 and the second transistor and the second conductive via 204' are arranged mirror-symmetrically with respect to a symmetry plane along line BB' as shown in FIG. 4. In the following paragraphs, the description "the connection line 401 and 401'" is simply used as an abbreviation of the description "a connection line including but not limited to connection wires 401 and 401', and does not make any restriction to the total numbers of the connection wires and vias electrically connecting the connection wires the connection line includes.

The active regions 202 and 203 are the regions on the substrate (e.g. silicon) for forming source/drain regions. In some embodiments, the first transistor further includes a pair of first source/drain regions in the first active region 202, wherein the source region and the drain region are formed on the active region on opposite sides of the first gate electrode, as the arrangement of the source region 103 and the drain region 104 shown in FIG. 1. Similarly, in some embodiments, the second transistor further includes a pair of second source/drain regions in the second active region 203 and on opposite sides of the second gate electrode.

Referring back to FIG. 4, the conductive vias 204 and 204', which are designed to connect the gate electrodes of the transistors to the connection line 401 and 401', are formed on the gate line 201 to electrically connect the gate electrodes. To control the pair of transistors of the integrated circuit structure of FIG. 4, the conductive vias are formed on the surface of the gate line 201 within the areas of the surface of the gate electrodes and the area between the two gate electrodes. In some embodiments, the first conductive via 204 is formed on the gate line 201 overlapping the first gate electrode and the first channel, and the second conductive via 204' is formed on the gate line 201 overlapping the second gate electrode and the second channel.

In some embodiments, the first conductive via 204 is located on the first gate electrode within an area having a vertical projection apart from the first active region and the first channel, and the second conductive via 204' is located on the second gate electrode within an area having a vertical projection apart from the second active region and the second channel.

In some embodiments, the gate line 201 is a continuous line so that the first gate electrode is structurally connected to the second gate electrode. For example, as shown in FIG. 4, the gate electrodes as described above are formed along the gate line 201 and the first gate electrode and the second gate electrode are thus structurally connected. In some embodiments, the parallel lines on both the right side and the left side of the gate line 201 are dummy gate lines without any gate electrode formed thereon.

Figure 6B:
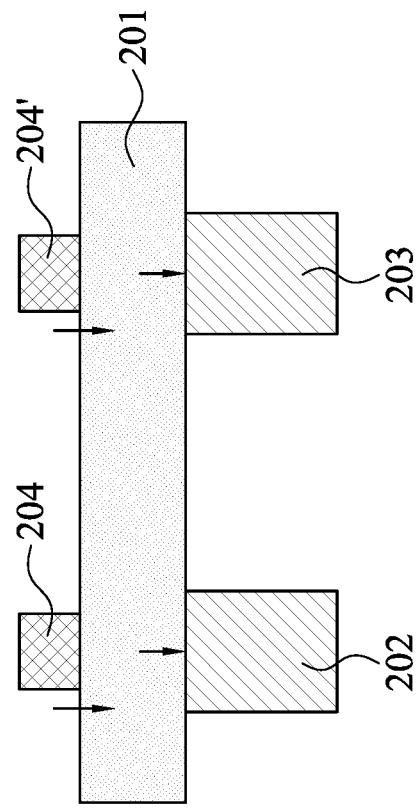
FIG. 6B shows a cross-sectional view of the structure shown in FIG. 5A.
Figure 6A:
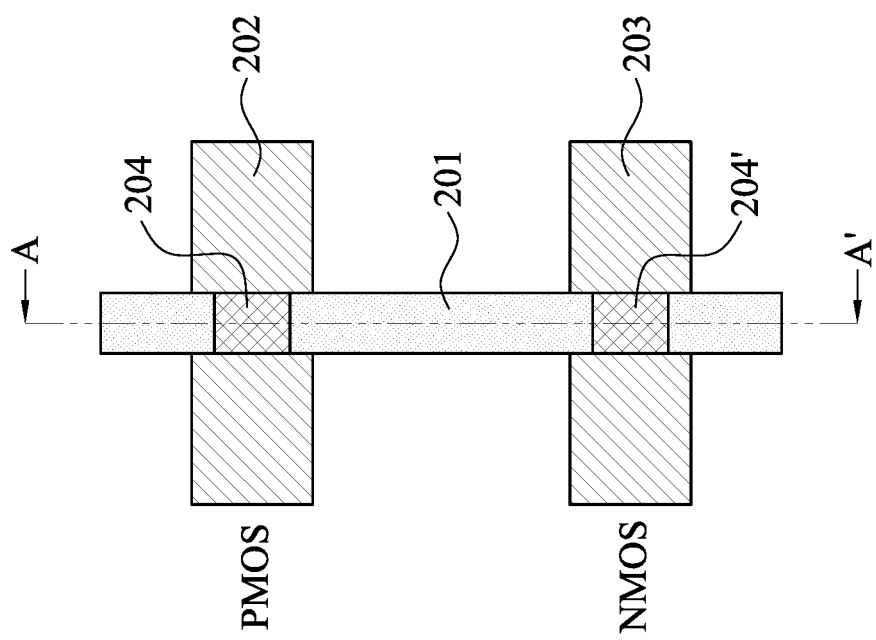
FIG. 6A shows a partial and simplified enlargement of the integrated circuit structure shown in FIGS. 4 and 5.

In some embodiments, the integrated circuit structure shown in FIG. 4 is a CMOS transistor including a pair of a PMOS transistor and an NMOS transistor that are electrically connected to the connection line 401 and 401' by the two conductive vias 204 and 204' connecting to each of the gate electrodes of the PMOS transistor and the NMOS transistor, respectively. Referring to FIGS. 6A and 6B, FIG. 6A is a partial and simplified enlargement of the integrated circuit structure shown in FIGS. 4 and 5, and FIG. 6B is a cross-sectional view of the structure shown in FIG. 5A along the AA' line. Specifically, the connection line 401 and 401' in FIG. 4 is not shown in FIGS. 5A and 5B for the ease of making comparison with the integrated circuit structure of FIG. 2. Compared to the integrated circuit structure shown in FIG. 2, the integrated circuit structure including two transistors connected to the connection line 401 and 401' with two conductive vias exhibits reduced RC delay by decreasing half of the gate resistance. Furthermore, due to the structural design, the sheet resistance of the gate line can be reduced to a value close to 0 in the case when the conductive vias 204 and 204' are disposed on the gate line 201 within the area of the surface of the gate electrodes.

Figure 7:
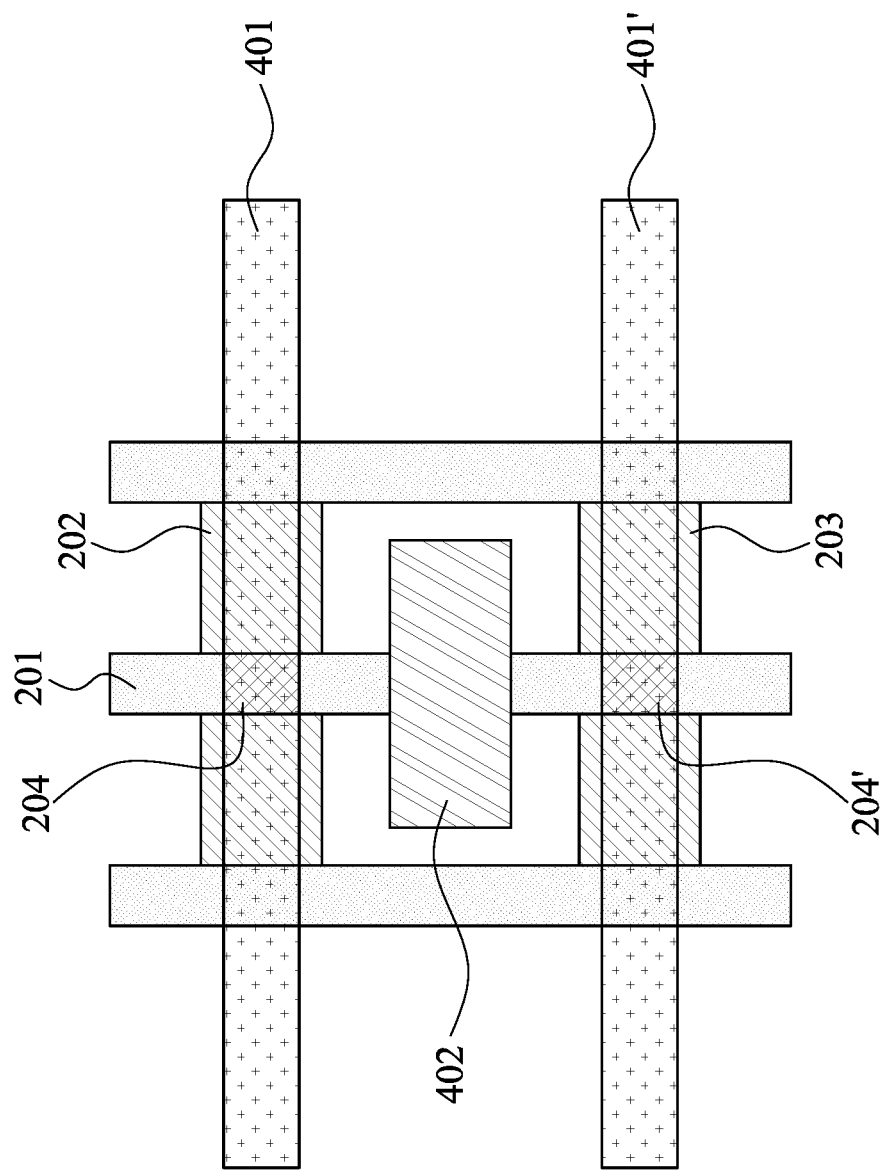
FIG. 7 also shows exemplary plan view of an integrated circuit structure in accordance with some embodiments of the present disclosure.

In some embodiments, the first gate electrode is structurally separated from the second gate electrode. Referring to FIG. 7, similar to the integrated circuit structure of FIG. 4, FIG. 7 also shows exemplary plan view of an integrated circuit structure having two transistors with two conductive vias electrically connecting to the two transistors, except that the first gate electrode and the second gate electrode are separated. In some embodiments, the first gate electrode and the second gate electrode are formed on the same gate line 201, but the connection between the first and second gate electrode is cut by exposing and etching a pattern to the gate line 201 within the space between the first and second gate electrode and filling in a non-conductive material, such as dielectric material, to both physically and electrically separate the first and second gate electrodes.

In some embodiments, the integrated circuit structure shown in FIG. 4 is a CMOS transistor including a pair of a PMOS transistor and an NMOS transistor that are electrically connected to the connection line 401 and 401' by the two conductive vias ("via contacts") 101 and 101' connecting to each of the gate electrodes of the PMOS transistor and the NMOS transistor, respectively.

Though there is not any specific restriction to the extending direction of the gate line 201, in some embodiments, the first active region 202 and the second active region 203 are substantially arranged in parallel, and extending in a first direction. In addition, in some embodiments, the first gate electrode is substantially in line with the second gate electrode in a second direction. In some embodiments, the first direction is orthogonal to the second direction.

In some embodiments, the connection line includes a pair of first connection wires 401 and 401' disposed on and electrically connecting the first conductive via 204 and the second conductive via 204', respectively; a pair of third conductive vias disposed on and electrically connected to the pair of first connection wires 401 and 401', respectively; and a second connection wire disposed on and electrically connected to the first connection wires 401 and 401' through the pair of third conductive vias.

Thought there is not any specific restriction to the extending direction of the pair of first connection wires, in some embodiments of the present disclosure, the pair of the first connection wires are arranged substantially in parallel, and extending along the first direction. In addition, in some embodiments, the second connection wire extends substantially along the second direction. In some embodiments, the first direction is orthogonal to the second direction.

In some embodiments, the integrated circuit structure shown in FIGS. 4 and 5 includes a PMOS transistor, an NMOS transistor and a connection line. The PMOS transistor includes a first active region 202 extending in a first direction; a first gate electrode 101 positioned on the first active region 202 and extending in a second direction different from the first direction; a first channel (not shown) in the first active region 202 and under the first gate electrode 101; and a first conductive via 204 disposed on the first gate electrode 101 and electrically connected to the first gate electrode 101. Similarly, the NMOS transistor includes a second active region 203 extending in the first direction and parallel to the first active region 202; a second gate electrode 101' positioned on the second active region 203 extending in the second direction; a second channel in the second active region 203 and under the second gate electrode 101'; and a second conductive via 204' disposed on the second gate electrode 101' and electrically connected to the second gate electrode 101'; and a connection line 401 and 401' electrically connecting the first conductive via 204 and the second conductive via 204'.

In some embodiments, the first gate electrode 101 and the second gate electrode 101' include tantalum gate electrodes, tungsten gate electrodes, tantalum nitride gate electrodes, titanium nitride gate electrodes or polycrystalline silicon gate electrodes. In some embodiments, the first gate electrode 101 and the second gate electrode 101' include polycrystalline silicon gate electrodes.

Figure 8A:
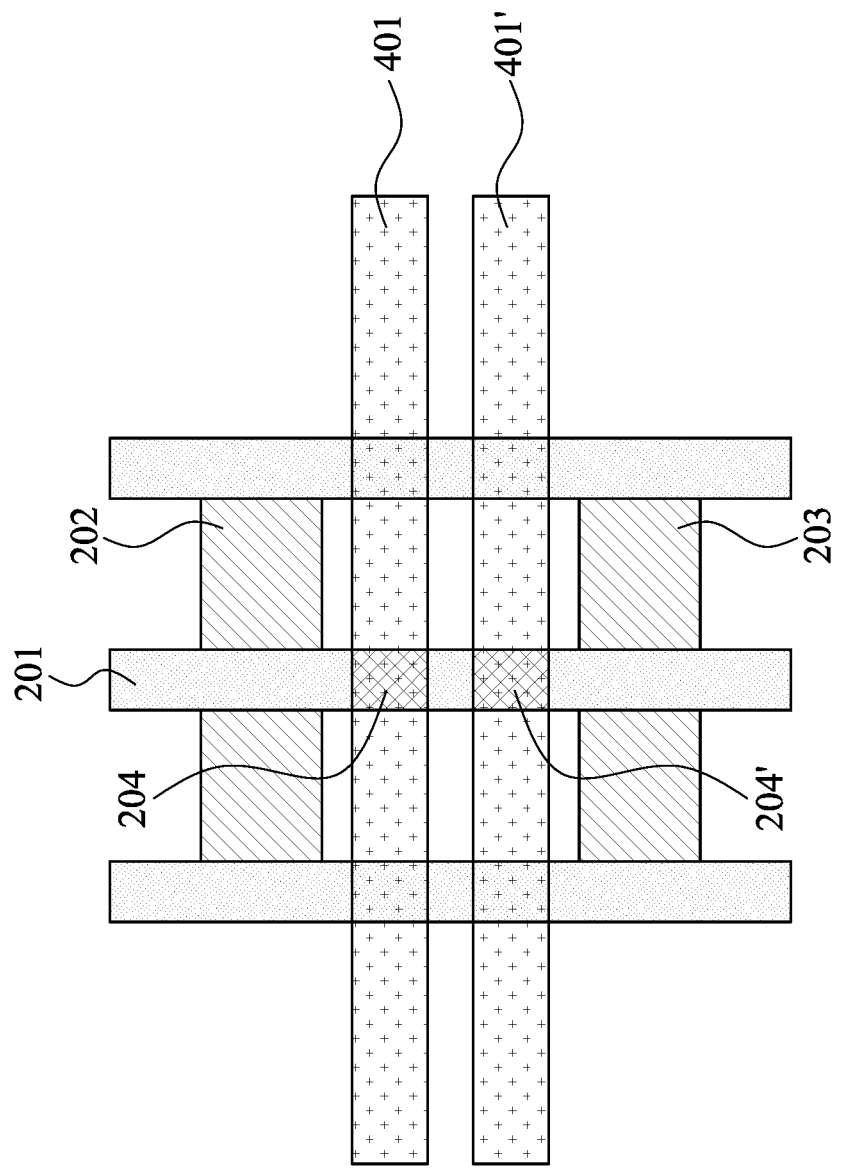
FIG. 8A shows exemplary plan view of an integrated circuit structure in accordance with some embodiments of the present disclosure.
Figure 8B:
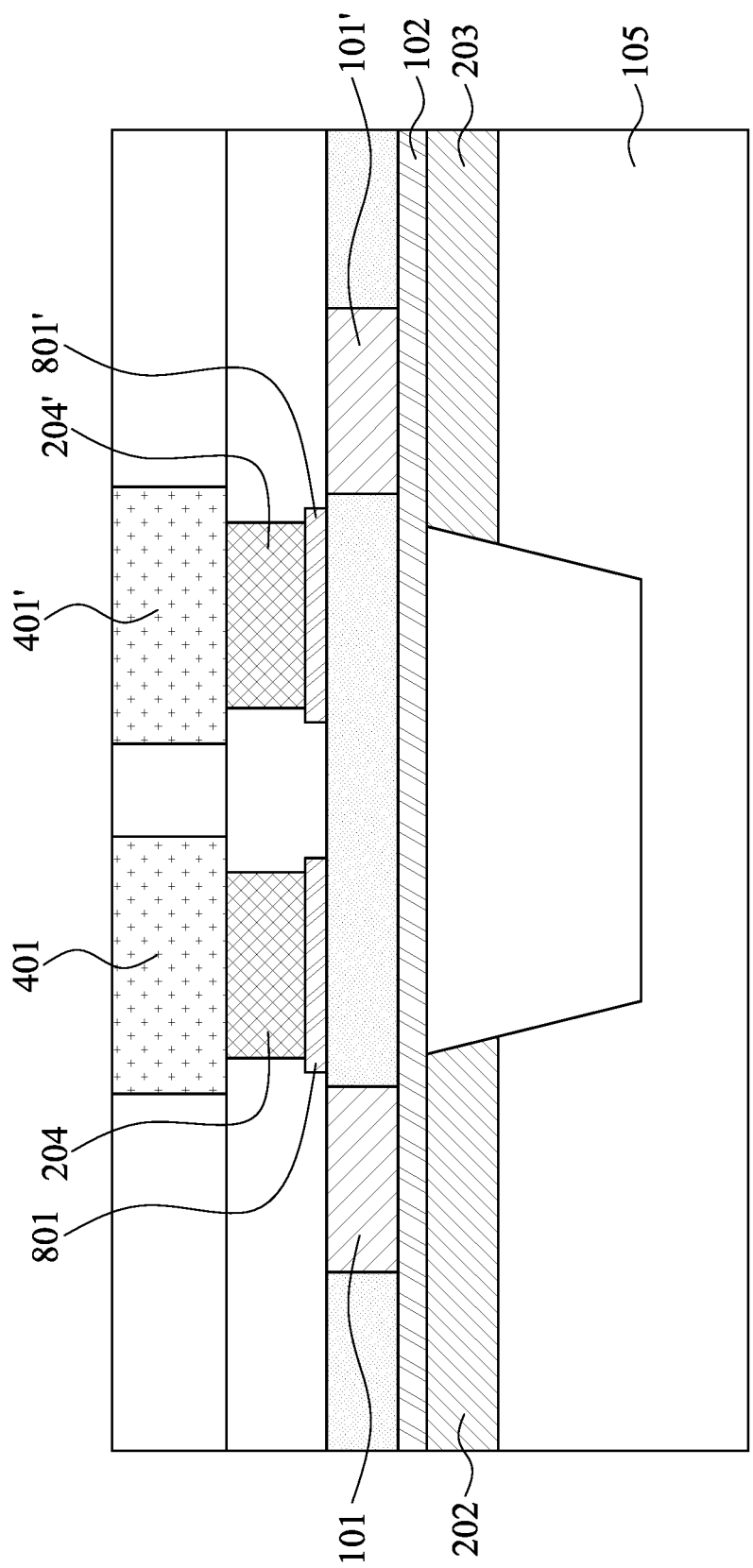
FIG. 8B shows the cross-sectional view of the integrated circuit structure of FIG. 8A.

Referring to FIGS. 8A and 8B, FIG. 8A shows exemplary plan view of an integrated circuit structure in accordance with some embodiments of the present disclosure, and FIG. 8B shows the cross-sectional view of the integrated circuit structure of FIG. 8A. In FIGS. 8A and 8B, the integrated circuit structure further includes a first metal-over-poly layer 801 positioned between the first gate electrode 101 and the first conductive via 204 to electrically connect the first gate electrode 101 and the first conductive via 204; and a second metal-over-poly layer 801' positioned between the second gate electrode 101' and the second conductive via 204' to electrically connect the second gate electrode 101' and the second the second conductive via 204'.

In some embodiments, the first gate electrode 101 and the second electrode 101' are formed on the same gate line 201 along the second direction so that the first gate electrode and the second gate electrode 101' are connected. In some embodiments, the first gate electrode and the second electrode are separated from each other.

In some embodiments, referring back to FIG. 4 the first conductive via 204 is positioned on the first gate electrode 101 within an area overlapping the first active region 202, and the second conductive via 204' is positioned on the second gate electrode 101' within an area overlapping the second active region 203. In some embodiments, referring back to FIG. 8, the first conductive via 204 is positioned on the first gate electrode 101 within an area having a vertical projection apart from the first active region 202, and the second conductive via 204' is positioned on the second gate electrode 101' within an area having a vertical projection apart from the second active region 203 as shown in FIG. 8.

Figure 9:
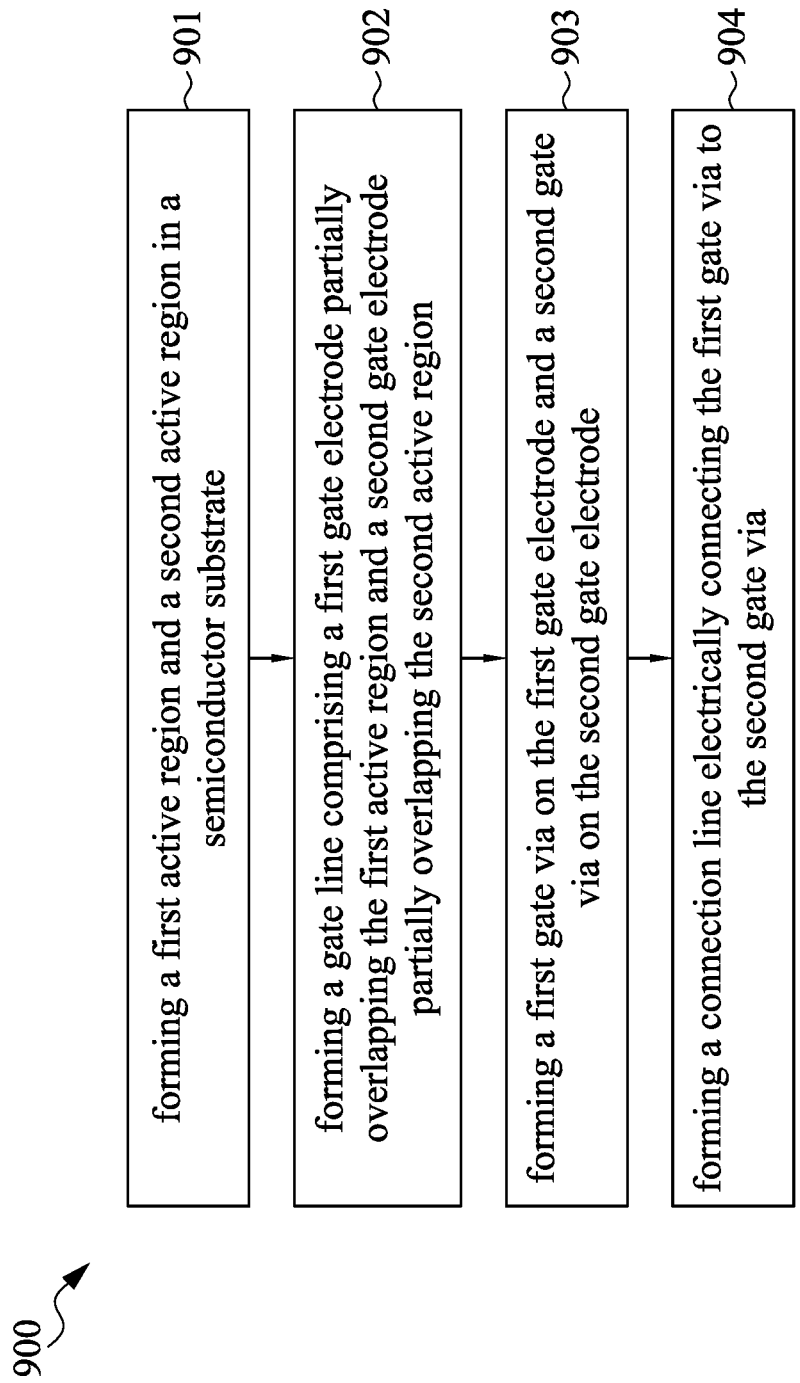
FIG. 9 is a flow chart of a method for manufacturing an integrated circuit structure in accordance with some embodiments of the present disclosure.

Referring to FIG. 9, FIG. 9 is a flow chart of a method 900 for manufacturing an integrated circuit structure in accordance with some embodiments of the present disclosure. At operation 901, a first active region and a second active region are formed in a semiconductor substrate. At operation 902, a gate line including a first gate electrode and a second gate electrode are formed above the first active region and the second active regions to partially overlap the first active region and the second active region. At operation 903, a first conductive via is formed on the first gate electrode and a second conductive via is formed on the second gate electrode. At operation 904, a connection line is formed above the first conductive via and the second conductive via to electrically connect the first conductive via and the second conductive via.

In some embodiments, in need for cutting the electrical connection between the gate electrodes of the pair of the transistors in the aforementioned integrated circuit structure manufactured according to the process illustrated in FIG. 9, the process may further includes cutting the gate line to structurally separate the first gate electrode and the second gate electrode by exposing and etching a pattern to the gate line within the space between the first and second gate electrode and filling in a non-conductive material, such as dielectric material, to both physically and electrically separate the first and second gate electrodes.

In some embodiments, an integrated circuit structure is provided. The integrated circuit structure includes a first transistor, a second transistor, a first conductive via, a second conductive via, and a connection line. The first transistor includes a first active region, a first gate electrode over the first active region; and a first channel in the first active region and under the first gate electrode. The second transistor is adjacent to the first transistor. The second transistor includes a second active region, a second gate electrode over the second active region, and a second channel in the second active region and under the second gate electrode. The first conductive via is electrically connected to the first gate electrode. The second conductive via is electrically connected to the second gate electrode. The connection line electrically connects the first conductive via and the second conductive via. The first transistor and the first conductive via and the second transistor and the second conductive via are arranged mirror-symmetrically with respect to a symmetry plane.

In some embodiments, an integrated circuit structure is provided. The integrated circuit structure includes a p-type metal-oxide-semiconductor (PMOS) transistor, an n-type metal-oxide-semiconductor (NMOS) transistor, and a connection line. The PMOS transistor includes a first active region extending in a first direction, a first gate electrode positioned on the first active region and extending in a second direction different from the first direction, a first channel in the first active region and under the first gate electrode, and a first conductive via disposed on the first gate electrode and electrically connected to the first gate electrode. The n-type metal-oxide-semiconductor (NMOS) transistor includes a second active region extending in the first direction and parallel to the first active region, a second gate electrode positioned on the second active region extending in the second direction, a second channel in the second active region and under the second gate electrode, and a second conductive via disposed on the second gate electrode and electrically connected to the second gate electrode. The connection line electrically connects the first conductive via and the second conductive via.

In some embodiments, a method for manufacturing an integrated circuit structure is provided. The method includes following operations. A first active region and a second active region is formed in a semiconductor substrate. A gate line including a first gate electrode partially overlapping the first active region and a second gate electrode partially overlapping the second active region is formed. A first conductive via is formed on the first gate electrode and a second conductive via is formed on the second gate electrode. A connection line electrically connecting the first conductive via and the second conductive via is formed.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure, comprising:
   a first transistor comprising:
      a first active region;
      a first gate electrode over the first active region; and
      a first channel in the first active region and under the first gate electrode;
   a second transistor adjacent to the first transistor, the second transistor comprising:
      a second active region;
      a second gate electrode over the second active region; and
      a second channel in the second active region and under the second gate electrode;
   a first conductive via electrically connected to the first gate electrode;
   a second conductive via electrically connected to the second gate electrode; and
   a connection line electrically connecting the first conductive via and the second conductive via, the connection line comprising:
      a pair of first connection wires disposed on and electrically connecting the first conductive via and the second conductive via, respectively;
      a pair of third conductive vias disposed on and electrically connected to the pair of first connection wires, respectively; and
      a second connection wire disposed on and electrically connected to the pair of third conductive vias,
   wherein the first transistor and the first conductive via and the second transistor and the second conductive via are arranged mirror-symmetrically with respect to a symmetry plane.

2. The integrated circuit structure according to claim 1, wherein the first transistor further comprises a pair of first source/drain regions in the first active region and on opposite sides of the first gate electrode, and the second transistor further comprises a pair of second source/drain regions in the second active region and on opposite sides of the second gate electrode.

3. The integrated circuit structure according to claim 1, wherein the first conductive via overlaps the first gate electrode and the first channel, and the second conductive via overlaps the second gate electrode and the second channel.

4. The integrated circuit structure according to claim 1, wherein the first conductive via is located on the first gate electrode within an area having a vertical projection apart from the first active region and the first channel, and the second conductive via is located on the second gate electrode within an area having a vertical projection apart from the second active region and the second channel.

5. The integrated circuit structure according to claim 1, wherein the first gate electrode is structurally connected to the second gate electrode.

6. The integrated circuit structure according to claim 1, wherein the first gate electrode is structurally separated from the second gate electrode.

7. The integrated circuit structure according to claim 1, wherein the first active region and the second active region are substantially arranged in parallel, and extending in a first direction.

8. The integrated circuit structure according to claim 7, wherein the first gate electrode is substantially in line with the second gate electrode in a second direction.

9. The integrated circuit structure according to claim 8, wherein the pair of first connection wires are arranged substantially in parallel, and extending along the first direction.

10. The integrated circuit structure according to claim 8, wherein the second connection wire extends substantially along the second direction.

11. An integrated circuit structure, comprising:
a first transistor comprising:
a first active region extending in a first direction; and
a first gate electrode positioned on the first active region and extending in a second direction different from the first direction;
a second transistor comprising:
a second active region extending in the first direction and parallel to the first active region; and
a second gate electrode positioned on the second active region extending in the second direction, wherein the first gate electrode and the second gate electrode comprise polycrystalline silicon gate electrodes;
a first conductive via electrically connected to the first gate electrode;
a second conductive via electrically connected to the second gate electrode;
a connection line electrically connecting the first conductive via and the second conductive via;
a first metal-over-poly layer positioned between the first gate electrode and the first conductive via to electrically connect the first gate electrode and the first conductive via; and
a second metal-over-poly layer positioned between the second gate electrode and the second conductive via to electrically connect the second gate electrode and the second conductive via,
wherein the first transistor and the first conductive via and the second transistor and the second conductive via are arranged mirror-symmetrically with respect to a symmetry plane and the first gate electrode and the second gate electrode are arranged mirror-symmetrically with respect to the symmetry plane.

12. The integrated circuit structure according to claim 11, wherein the first gate electrode and the second gate electrode are connected to each other along the second direction.

13. The integrated circuit structure according to claim 11, wherein the first gate electrode and the second gate electrode are separated from each other.

14. The integrated circuit structure according to claim 11, wherein the first conductive via is positioned on the first gate electrode within an area having a vertical projection apart from the first active region, and the second conductive via is positioned on the second gate electrode within an area having a vertical projection apart from the second active region.

15. An integrated circuit structure, comprising:
a complementary metal-oxide-semiconductor (CMOS) transistor comprising a pair of a first transistor and a second transistor, the first transistor comprising a first gate electrode, the second transistor comprising a second gate electrode;
a first conductive via electrically connected to the first gate electrode;
a second conductive via electrically connected to the second gate electrode; and
a connection line electrically connecting the first conductive via and the second conductive via,
wherein the first transistor and the first conductive via and the second transistor and the second conductive via are arranged mirror-symmetrically with respect to a symmetry plane and the first gate electrode and the second gate electrode are arranged mirror-symmetrically with respect to the symmetry plane.

16. The integrated circuit structure according to claim 15, wherein the first transistor is a p-type metal-oxide-semiconductor (PMOS) transistor and the second transistor is an n-type metal-oxide-semiconductor (NMOS) transistor.

17. The integrated circuit structure according to claim 15, wherein the first transistor further comprises a first active region, the second transistor further comprises a second active region, the first conductive via overlaps the first active region, and the second conductive via overlaps the second active region.

18. The integrated circuit structure according to claim 15, wherein the connection line comprises:
a pair of first connection wires disposed on and electrically connecting the first conductive via and the second conductive via, respectively; and
a pair of third conductive vias disposed on and electrically connected to the pair of first connection wires, respectively.

19. The integrated circuit structure according to claim 18, wherein the connection line further comprises:
a second connection wire disposed on and electrically connected to the pair of third conductive vias.

20. The integrated circuit structure according to claim 15, further comprising:
a first metal layer positioned between the first gate electrode and the first conductive via to electrically connect the first gate electrode and the first conductive via; and
a second metal layer positioned between the second gate electrode and the second conductive via to electrically connect the second gate electrode and the second conductive via.

* * * * *